(12) United States Patent
Roh

(10) Patent No.: US 6,344,965 B1
(45) Date of Patent: *Feb. 5, 2002

(54) CAPACITOR USING HIGH DIELECTRIC CONSTANT FILM FOR SEMICONDUCTOR MEMORY DEVICE AND FABRICATION METHOD THEREFOR

(75) Inventor: Jae-Sung Roh, Kyungki-Do (KR)

(73) Assignee: Hyundai Electronics Industries Co., Ltd., Ichon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/369,255

(22) Filed: Aug. 6, 1999

(30) Foreign Application Priority Data

Mar. 16, 1999  (KR) ............................................. 99-8805

(51) Int. Cl.[7] .......................... H01G 4/06; H01G 4/008; H01L 27/108
(52) U.S. Cl. .................... 361/311; 361/305; 361/321.1; 257/304; 257/306
(58) Field of Search ................................ 361/303–305, 361/311, 312, 313, 320, 321.1–321.5; 438/386; 257/301, 302, 303, 304, 305

(56) References Cited

U.S. PATENT DOCUMENTS

| 5,385,859 A | | 1/1995 | Enomoto | 437/52 |
|---|---|---|---|---|
| 5,471,418 A | * | 11/1995 | Tanigawa | 365/149 |
| 5,506,166 A | * | 4/1996 | Sandhu et al. | 438/396 |
| 5,604,659 A | * | 2/1997 | Madan | 361/303 |
| 5,691,219 A | * | 11/1997 | Kawakubo et al. | 438/253 |
| 5,793,057 A | * | 8/1998 | Summerfelt | 257/55 |
| 5,952,687 A | * | 9/1999 | Kawakubo et al. | 257/296 |
| 6,078,492 A | * | 6/2000 | Huang et al. | 361/301.4 |
| 6,127,734 A | * | 10/2000 | Kimura | 257/774 |

* cited by examiner

*Primary Examiner*—Dean A. Reichard
*Assistant Examiner*—Eric W. Thomas
(74) *Attorney, Agent, or Firm*—Fleshner & Kim, LLP

(57) ABSTRACT

A capacitor using a high dielectric constant film for a semiconductor memory device, and a fabrication method thereof are provided that improve a process margin and achieve a stable contact. The capacitor can be fabricated by forming an impurity layer at a surface of a semiconductor substrate, forming an interlayer insulation film on the semiconductor substrate having a contact hole filled with a conductive material coupled to the impurity layer, and sequentially forming a first oxide film, a nitride film and a second oxide film on the interlayer insulation film so that the contact hole is exposed therethrough, and the nitride film and the first oxide film are partially exposed through the second oxide film. A diffusion barrier film is formed at outer and side portions of the second oxide film, outer and side portions of the nitride film, side portions of the first oxide film, and on an exposed portion of the contact hole. A first electrode is formed on the diffusion barrier film, however, the diffusion barrier film and the first electrode are removed from an outer portion of the second oxide film to isolate the cell of the memory cell having the capacitor. Finally, a high dielectric constant film is formed on the outer portions of the second oxide film and the diffusion barrier film, and on the first electrode, and a second electrode is formed on the high dielectric constant film.

21 Claims, 5 Drawing Sheets

CAPACITOR USING HIGH DIELECTRIC CONSTANT FILM FOR SEMICONDUCTOR MEMORY DEVICE AND FABRICATION METHOD THEREFOR

BACKGROUND OF THE INVENTION

1. Field of the Invention

The present invention relates to a capacitor for a semiconductor memory device and to a fabrication method thereof.

2. Background of the Related Art

It is desirable to increase a storage capacity per unit area of a capacitor in view of the higher-integration trends in Dynamic Random Access Memories (DRAMs). Thus, a capacitor forming a DRAM memory cell employs a film including a material having a much higher dielectric constant relative to a silicon-based dielectric material that has been generally used.

FIG. 1A shows an example of a related art capacitor using a film having a high dielectric constant in a semiconductor memory device. The related art capacitor as illustrated in FIG. 1A is fabricated as follows. A semiconductor substrate 1 has an impurity layer 2 formed at its surface. An interlayer insulation film 3 is formed on the substrate 1 with a contact hole 4 therethrough exposing the impurity layer 2. The contact hole 4 is partially filled with a conductive material. A node contact 5 is formed to be connected with the conductive material in the contact hole 4, and is formed of a polycrystalline silicon. A diffusion barrier film 6 and a first electrode 7 on the diffusion barrier film 6 are formed at a predetermined region on the interlayer insulation film 3 including the node contact 5. A dielectric film 8 having a high dielectric constant is formed on the interlayer insulation film 3, upper and side portions of the first electrode 7 and side portions of the diffusion barrier film 6. A second electrode 9 is formed on the high dielectric constant film 8 to complete fabrication of the capacitor.

In the related art capacitor using the high dielectric constant film, the diffusion barrier film 6 prevents the first electrode 7 from reacting with the node contact 5, which consists of the polycrystalline silicon, while the first electrode 7 is formed of platinum or the like. In addition, the diffusion barrier film 6 prevents oxidation of the node contact 5 in an oxidizing atmosphere while forming the high dielectric constant film 8. Accordingly, the diffusion barrier film 6 is required to have a superior oxidation resisting property at a high temperature.

However, in the related art capacitor as shown in FIG. 1A, the sidewalls of the diffusion barrier film 6 are externally exposed, and thus directly exposed to the oxidizing atmosphere when the high dielectric constant film is formed. In addition, oxygen is diffused by a distance (d) in from the sidewalls. Thus, the node contact 5 consisting of the polycrystalline silicon is oxidized. To overcome the above-mentioned disadvantages, the diffusion barrier film may be formed at the inside of the node contact.

As shown in FIG. 1B, another related art capacitor has a diffusion barrier film 6' formed at the inside of a node contact 5'. However, even in the related art capacitor as shown in FIG. 1B, a distance (d') between the sidewall of the first electrode 7' and the diffusion barrier film 6' is generally less than 500A, which is similar to the oxygen diffusion distance (d) in the related art capacitor illustrated in FIG. 1A. As a result, it cannot prevent the node contact 5' from being oxidized.

FIG. 1C is a cross-sectional view illustrating an interface of the diffusion barrier film 6 and the node contact 5 when the diffusion barrier film 6 and the first electrode 7 are mis-aligned in the related art capacitor as shown in FIG. 1A. In other words, in FIG. 1C the diffusion barrier 6 and the first electrode 7 deviate from a central axis of the node contact 5 and are asymmetrically formed in the related art capacitor as illustrated in FIG. 1A. As shown in FIG. 1C, when the diffusion barrier film 6 and the first electrode 7 are mis-alignied, the node contact 5 is externally exposed and the high dielectric constant film 8 is formed thereon, which results in inferior contact and current leakage. Thus, the above-described related art capacitors using a high dielectric constant film for a semiconductor device have various disadvantages.

The above references are incorporated by reference herein where appropriate for appropriate teachings of additional or alternative details, features and/or technical background.

SUMMARY OF THE INVENTION

An object of the present invention is to provide a capacitor and method for forming the same that substantially obviates one or more disadvantages of the related art.

Another object of the present invention is to provide a capacitor and method for fabricating the same that provides a contact having an increased reliability.

Another object of the present invention is to provide a capacitor that increases a process margin for a first electrode position.

Another object of the present invention is to provide a capacitor using a high dielectric constant film and method for making the same that provides a contact having an increased reliability and an increased tolerance for electrode positioning.

In order to achieve at least the above-described objects of the present invention in a whole or in parts, there is provided a capacitor using a high dielectric constant film for a semiconductor memory device that includes a semiconductor substrate having an impurity layer at its surface; an interlayer insulation film formed on the semiconductor substrate and including a contact hole therethrough filled at an inner end portion thereof with a conductive material connected to the impurity layer; a first oxide film formed on an outer portion of 10 the interlayer insulation film; a nitride film formed on an outer portion of the first oxide film; a patterned second oxide film formed on a region of the nitride film; a diffusion barrier film formed on side portions of the second oxide film, outer and side portions of the nitride film where the second oxide film is not formed, side portions of the first oxide film, and an outer end portion of the contact hole; a first electrode formed on the diffusion barrier film; a high dielectric constant film formed on outer portions of the second oxide film, on outer portions of the diffusion barrier film, and on the first electrode; and a second electrode formed on the high dielectric constant film.

To further achieve the above-described objects of the present invention in a whole or in parts, there is provided a capacitor for a semiconductor memory device that includes a patterned first insulation film that exposes a top surface of a contact hole over a semiconductor substrate, a patterned second insulation film on the patterned first insulation film, a diffusion barrier film on side portions of the second insulation film, side portions of the first insulation film and the top surface of the contact hole, a first electrode on the diffusion barrier film, a dielectric film on outer portions of the second insulation film, outer portions of the diffusion barrier film, and the first electrode, and a second electrode on the dielectric film.

To further achieve the above-described objects in a whole or in parts, there is provided a method for manufacturing a capacitor according to the present invention that includes forming an impurity layer at an outer surface of a semiconductor substrate, forming an interlayer insulation film on the semiconductor substrate having a contact hole therethrough filled with a conductive material, wherein a bottom surface of the conductive material contacts the impurity layer, sequentially forming a first oxide film, a nitride film and a second oxide film on the interlayer insulation film so that a top surface of the conductive material is exposed therethrough, and wherein the nitride film and the first oxide film are partially exposed through the second oxide film, forming a diffusion barrier film at outer and side portions of the second oxide film, side portions of the nitride film, side portions of the first oxide film, and the top surface of the conductive material, forming a first electrode on the diffusion barrier film, removing the diffusion barrier film and the first electrode from an outer portion of the second oxide film, forming a high dielectric constant film on the outer portions of the second oxide film and the diffusion barrier film, respectively, and on the first electrode, and forming a second electrode on the high dielectric constant film.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
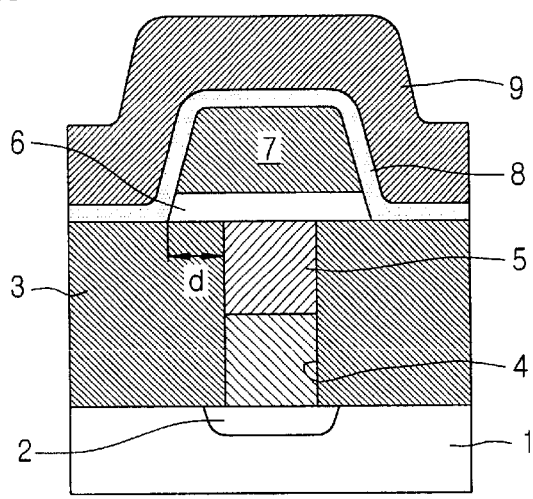
FIG. 1A is a cross-sectional diagram illustrating a related art capacitor for a semiconductor memory device using a high dielectric constant film.
Figure 1B:
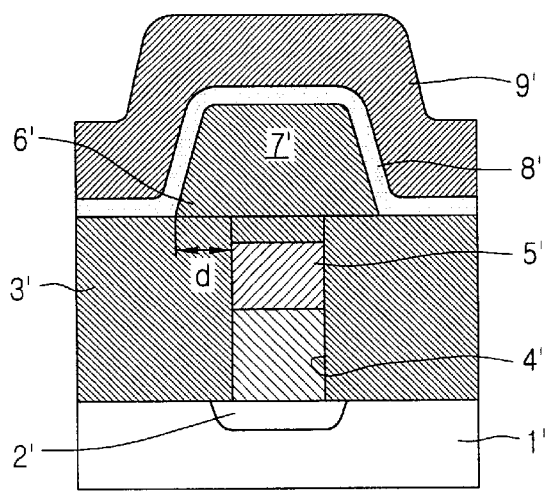
FIG. 1B is a cross-sectional diagram illustrating another related art capacitor for a semiconductor memory device using a high dielectric constant film.
Figure 1C:
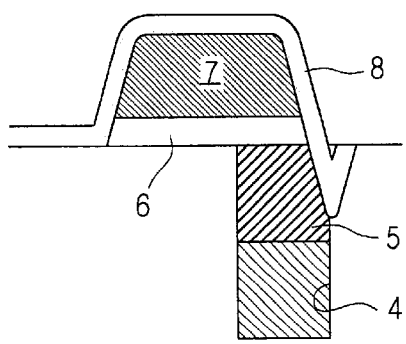
FIG. 1C is a cross-sectional view illustrating an interface between a diffusion barrier film and a node contact in the capacitor of FIG. 1A when the diffusion barrier film and first electrode are misaligned.
Figure 2A:
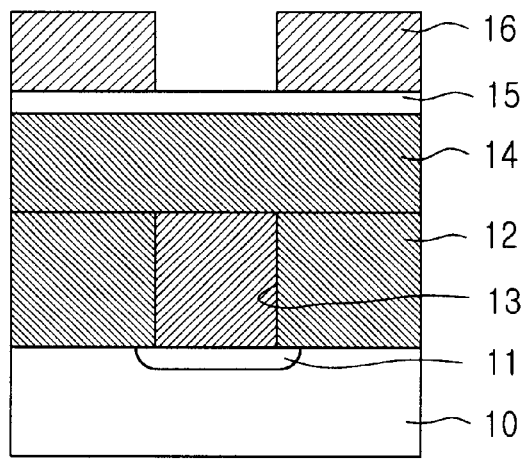
FIGS. 2A to 2F are diagrams that show cross-sectional views illustrating a preferred embodiment of a process for fabricating a capacitor for a semiconductor memory device in accordance with the present invention.

A preferred embodiment of a method for fabricating a capacitor in accordance with the present invention will now be described. As shown in FIG. 2A, a semiconductor substrate 10 is formed having an impurity layer 11 preferably formed at its surface and an interlayer insulation film 12 formed thereon. A contact hole 13 that exposes the impurity layer 11 is provided in the interlayer insulation film 12. The contact hole 13 is preferably filled with a conductive material and centered on the impurity layer 11. As illustrated in FIG. 2A, a first oxide film 14 is formed on the interlayer insulation film 12 including over the contact hole 13 by a chemical vapor deposition (CVD) process according to the preferred embodiment for fabricating a capacitor. A nitride film 15 is formed on the first oxide film 14, and then a first mask 16 is formed on the nitride film 15 exposing a region of the nitride film 15 that corresponds to the contact hole 13.

Figure 2B:
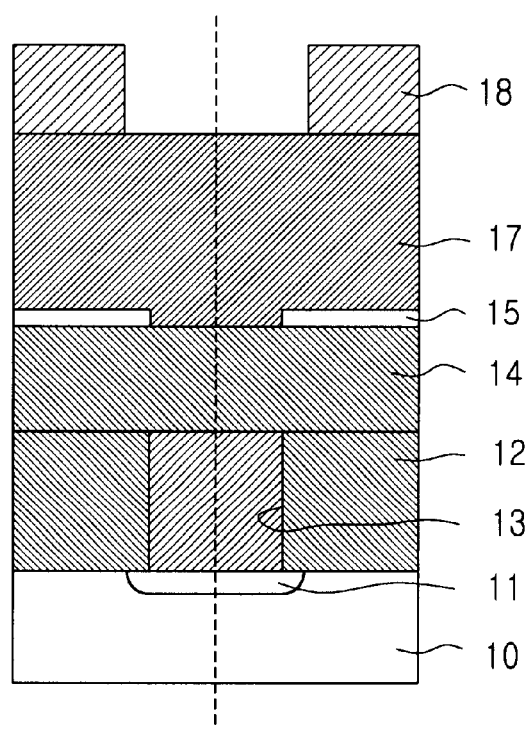

As shown in FIG. 2B, the exposed region of the nitride film 15 corresponding to the contact hole 13 is etched by using the first mask 16 to expose the first oxide film 14 through a hole in the nitride film 15. The size of the hole etched through the nitride film 15 preferably defines a width of a node contact 20a to be formed in a succeeding process. After a second oxide film 17 is formed on the nitride film 15 and on the exposed portion of the first oxide film 14 preferably by a CVD process, a second mask 18 is formed on the second oxide film 17. In the preferred embodiment for fabricating a capacitor, a center position of a hole of the second mask 18 is identical (i.e., aligned over a center position of the contact hole 13) to that of the contact hole 13. However, the hole of the second mask 18 is preferably greater in width than the contact hole 13. The size of the hole of the second mask 18 preferably defines the width of a first electrode 20b to be formed in a succeeding process.

Figure 2C:
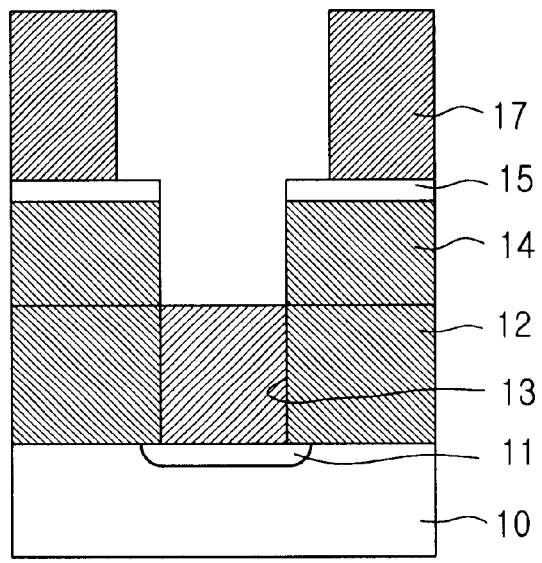

As shown in FIG. 2C, the second oxide film 17 and the first oxide film 14 are sequentially etched by using the second mask 18. In the preferred embodiment for fabricating a capacitor, the nitride film 15 is not etched, and the oxide films 14, 17 are selectively etched. When the second oxide film 17 is firstly etched, an etched region of the second oxide film 17 becomes a region for forming the first electrode 20b. As the second oxide film 17 is etched, the exposed nitride film 15 serves as a mask for etching the first oxide film 14. Accordingly, a region of the first oxide film 14 is etched more narrowly than the region for the first electrode 20b. The more narrowly etched portion of the first oxide film 14 preferably becomes a region for the node contact 20a.

Figure 2D:
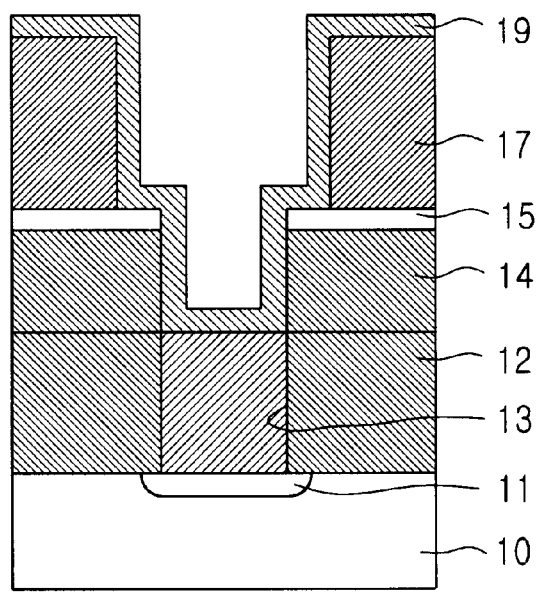

As shown in FIG. 2D, a diffusion barrier film 19 of Ti or TiN is formed over the surface of the configuration shown in FIG. 2C. Thus, the diffusion barrier 19 is on the exposed upper and side portions of the second oxide film 17, the exposed upper and side portions of the nitride film 15, the exposed side portions of the first oxide film 14, and the upper potion of the contact hole 13. The diffusion barrier film 19 is formed along the surface of the configuration of FIG. 2C, and preferably has a uniform thickness in order to have an identical surface shape conforming thereto. The materials composing the diffusion barrier film can further include for example, Ru, Ir and the like, in addition to Ti and TiN.

Figure 2E:
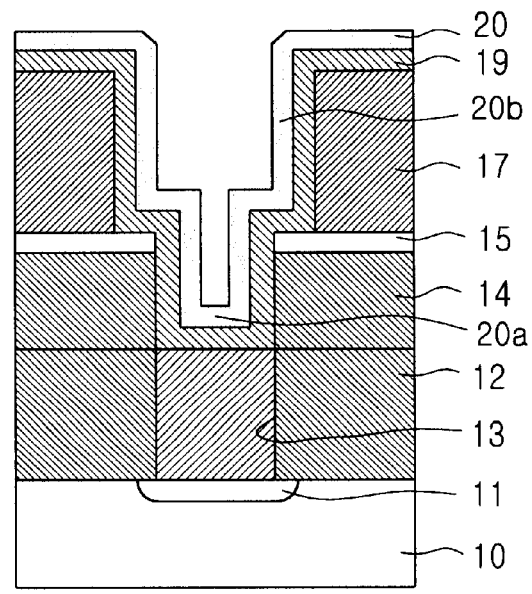

As shown in FIG. 2E, a platinum (Pt) film 20 is preferably formed on the diffusion barrier film 19 by a CVD process, and a self-aligning process of forming the node contact 20a and the first electrode 20b at the same time is completed. The platinum film 20 is formed along the surface of the diffusion barrier film 19. In the preferred embodiment for fabricating a capacitor, a portion of the platinum film 20 in the hole formed in the first oxide film 14 operates as the node contact 20a, and the other portion of the platinum film 20 in the hole formed in the second oxide film 17 operates as the first electrode 20b. Accordingly, the first electrode 20b and the node contact 20a are not formed by separate processes. The platinum film 20 is preferably formed by single deposition process that includes the regions serving as the first electrode 20b and as the node contact 20a. The self-aligning process preferably includes the single deposition process.

The materials composing the node contact 20a and the first electrode 20b can include RuO$_2$IrO$_2$, Ir and the like, in addition to the platinum film.

Figure 2F:
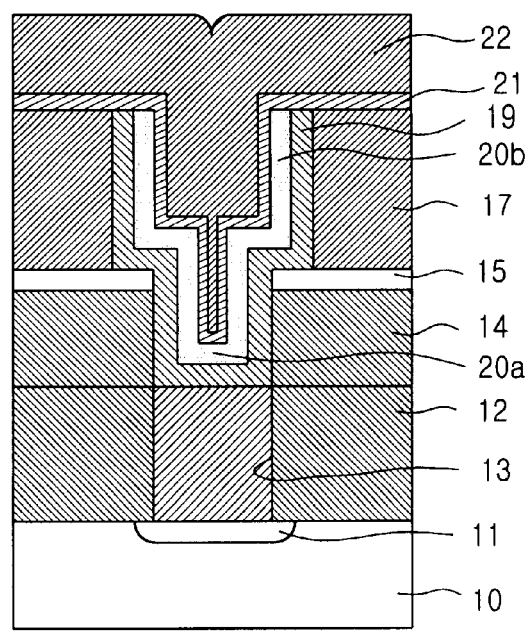

As shown in FIG. 2F, the platinum film 20 and the diffusion barrier film 19 formed over the upper portion of the second oxide film 17 are etched by an etchback process to be within the hole of the second oxide layer 17 and to separate the first electrode 20a from first electrodes of adjacent cells of a memory device. Thus, the platinum film 20 is formed as a single first electrode for a single cell.

As further shown in FIG. 2F, a high dielectric constant film 21 preferably formed of BST ((Ba,Sr)T$_2$O$_3$) is formed on the upper portions of the second oxide film 17, the diffusion barrier film 19 and the first electrode 20b, which are exposed by the etchback process, and over the platinum film 20. The materials forming the high dielectric constant film can also include Ta$_2$O$_5$, PZT (Pb(Zr,Ti)O$_3$) and the like, in addition to the BST. That is, the preferred embodiment for fabricating a capacitor uses materials having a higher dielectric constant than the generally-used silicon-based dielectric materials. The preferred embodiment for fabricating a capacitor is completed by forming a second electrode 22 on the high dielectric constant film 21.

Thus, a preferred embodiment of a capacitor according to the present invention is illustrated by FIG. 2F. The preferred embodiment of a capacitor according to the present invention can be formed according to the first preferred embodiment for fabricating a capacitor described above. However, the present invention is not intended to be so limited.

Figure 3:
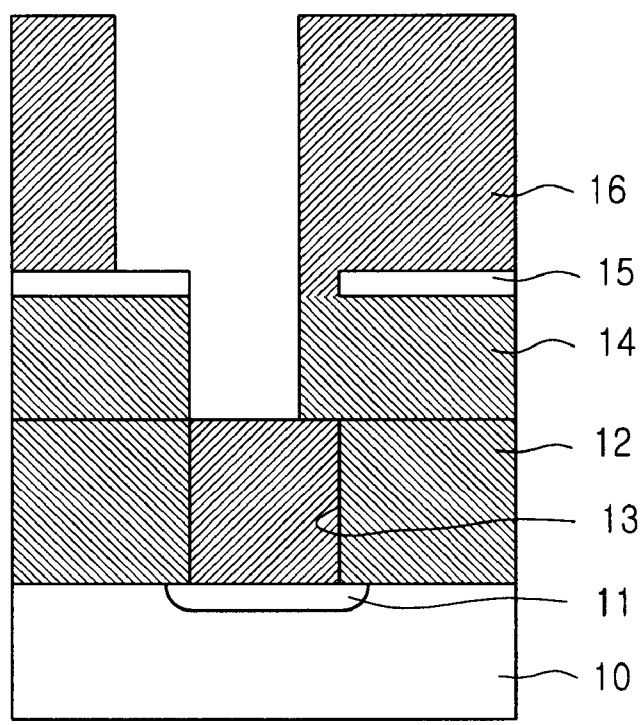
FIG. 3 is a diagram showing a cross-sectional view of a capacitor formed according to the preferred process of FIGS. 2A-2C when a second oxide film and a first oxide film are mis-aligned.

FIG. 3 is a diagram that shows a cross-sectional view of a partially formed capacitor according to the preferred embodiment for fabricating a capacitor. However, as shown in FIG. 3, the centering position of the hole in the second mask 18 used in fabricating a capacitor in accordance with the present invention is offset (e.g., not aligned) from that of the contact hole 13 and misaligned. As shown in FIG. 2B, the centering position of the hole in the second mask 18 is intended to be aligned with the center of the contact hole 13 in the preferred embodiment for fabricating a capacitor. As shown in FIG. 3, the second oxide film 17 and the first oxide film 14 were sequentially etched using a misaligned second mask 18, and is thus altered relative to the configuration shown in FIG. 2C. In a capacitor fabricated by sequentially carrying out the processes shown in FIGS. 2D to 2F in the configuration of FIG. 3, the first electrode is asymmetrically formed. However, even in this case, the contact hole under the diffusion barrier film is never exposed. As a result, a process margin determined in consideration of positioning error of the first electrode is smaller according to the preferred embodiments of the present invention than in the related art capacitor fabricating process.

As described above, the preferred embodiments of a capacitor and a method of fabricating a capacitor according to the present invention have various advantages. In the capacitor and method for making the same using the high dielectric constant film in accordance with preferred embodiments of the present invention, the diffusion barrier film is formed at the interface of the contact hole and the node contact, and thus, the node contact and first electrode are formed on the diffusion barrier film. Consequently, the diffusion barrier film is not exposed to an oxidizing atmosphere when the high dielectric constant film is formed. Accordingly, an oxidation resisting property of the diffusion barrier film can be significantly increased. In addition, the preferred embodiments overcome the disadvantages of the related art technique such as poor contact and current leakage generated because the node contact under the first electrode and the diffusion barrier film can be exposed when mis-aligned. Further, in the preferred embodiments, a proper margin can be provided despite a positioning (mis-registration) error when the first electrode is mis-aligned. Thus, the process margin is significantly improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A capacitor for a semiconductor memory device, comprising:
   a semiconductor substrate having an impurity layer exposed at a top surface;
   an interlayer insulation film on the semiconductor substrate having a first contact hole with a first diameter therethrough filled with a conductive material, wherein an inner end portion of the contact hole is coupled to the impurity layer;
   a patterned first oxide film on the interlayer insulation film;
   a patterned nitride film on the first oxide film, wherein a second contact hole having a second diameter approximately equal to the first diameter passes through the patterned first oxide film and the patterned nitride film to expose an outer end portion of the conductive material in the first contact hole;
   a patterned second oxide film on the nitride film having a third contact hole therethrough with a third diameter greater than the second diameter to expose the second contact hole;
   a diffusion barrier film formed on side portions of the second oxide film, side portions of the nitride film, side portions of the first oxide film, and the outer end portion of the contact hole;
   a first electrode on the diffusion barrier film;
   a dielectric film on outer portions of the second oxide film, outer portions of the diffusion barrier film, and the first electrode; and
   a second electrode on the dielectric film.

2. The capacitor according to claim 1, wherein a top surface of the nitride film is exposed in the third contact hole and a side surface of the nitride film is exposed in the second contact hole, and wherein the diffusion barrier film is on the top surface of the nitride film in the third contact hole.

3. The capacitor according to claim 1, wherein a center position of the third contact hole of the patterned second oxide film is aligned over a center portion of the first contact hole.

4. The capacitor according to claim 3, wherein the second contact hole in the first oxide film exposes the outer end portion of the first contact hole, and wherein the second contact hole is filled with the first electrode, the high dielectric film and the second electrode, respectively.

5. The capacitor according to claim 1, wherein a center position of the third contact hole of the patterned second oxide film is aligned over the contact hole.

6. The capacitor according to claim 1, wherein a center position of the third contact hole of the patterned second oxide film is not aligned over a center position of the first contact hole, and wherein the leakage current is reduced by the diffusion barrier film covering the outer end portion of the first contact hole.

7. The capacitor according to claim 1, wherein the diffusion barrier film is one selected from the group consisting of Ti, TiN, Ru and Ir, and wherein the first electrode and the second electrode is one selected from the group consisting of Pt, $RuO_2$, $IrO_2$, Ru and Ir.

8. The capacitor according to claim 1, wherein the dielectric film consists of a material having a higher dielectric constant than a silicon-based dielectric material.

9. The capacitor according to claim 1, wherein the dielectric film comprises one of BST ($(Ba,Sr)T_2O_3$), $Ta_2O_5$ and PZT ($Pb(Zr,Ti)O_3$).

10. The capacitor according to claim 1, wherein the second diameter is reduced in length from the third diameter by a width of an exposed top surface of the nitride film in the third contact hole.

11. The capacitor according to claim 1, wherein the first, second and third contact holes have substantially vertical sides.

12. A capacitor for a semiconductor memory device, comprising:
    a patterned first insulation film having a first contact hole with a first width that exposes a top surface of an initial contact hole over a semiconductor substrate;
    a patterned second insulation film having a second contact hole with a second width larger than the first width that exposes the first contact hole, wherein the patterned second insulation film is on the patterned first insulation film;
    a diffusion barrier film formed on side portions of the second insulation film, side portions of the first insulation film, a top surface of the first insulation film exposed in the second contact hole and the top surface of a conducted contact in the initial contact hole;
    a first electrode on the diffusion barrier film;
    a dielectric film on outer portions of the second insulation film, outer portions of the diffusion barrier film, and the first electrode;
    a second electrode on the dielectric film, wherein the first and second contact holes have substantially vertical sides;
    an impurity layer exposed at a top surface of the semiconductor substrate; and
    an interlayer insulation film on the semiconductor substrate having the initial contact hole therethrough filled with a conductive material, wherein a bottom surface of the initial contact hole is coupled to the impurity layer, wherein the patterned first insulation film comprises,
        a first oxide film on the interlayer insulation film, and
        a nitride film on the first oxide film, wherein the first oxide film and the nitride film are patterned to expose the top surface of the initial contact hole.

13. The capacitor according to claim 12, wherein when a center position of a second hole of the patterned second insulation film is not aligned over a center position of the contact hole the leakage current is reduced by the diffusion barrier film covering the outer end portion of the initial contact hole.

14. A capacitor for a semiconductor memory device, comprising:
    a semiconductor substrate having an impurity layer exposed at a top surface;
    a patterned first insulation film;
    a patterned second insulation film on the first insulation film, wherein the first and second insulation layers have a first contact hole therethrough with a first width, wherein an inner end portion of the first contact hole is coupled to the exposed impurity layer;
    a patterned third insulation film on the second insulation film, wherein the third insulation film has a second contact hole therethrough having a second width greater than the first width so that a side surface of the second insulation film is exposed in the first contact hole and a top surface is exposed in the second contact hole;
    a diffusion barrier film formed on side surfaces of the first, second and third insulation films and the top surface of the second insulation film;
    a first electrode on the diffusion barrier film;
    a dielectric film on the first electrode;
    a second electrode on the dielectric film; and
    an interlayer insulation film on the semiconductor substrate having a contact hole therethrough filled with a conductive material, wherein an inner end portion of the conductive material in the contact hole is coupled to the exposed impurity layer, and wherein the first and third insulation films are an oxide film and the second insulation film is a nitride film.

15. The capacitor according to claim 14, wherein a width of the top surface of the second insulation film in the second contact hole determines a difference between the first width and the second width.

16. The capacitor according to claim 14, wherein the second insulation film has an etch selectivity resistance different and higher than an etch selectivity resistance of the first and third insulation films.

17. The capacitor according to claim 14, wherein the second insulation film operates as a mask that determines the first contact hole width that is coupled to the impurity region, and wherein the second width determines a width of the first electrode.

18. The capacitor according to claim 14, wherein a center position of the second contact hole is not aligned over a center position of the exposed impurity region, and wherein the leakage current is reduced by the diffusion barrier film covering an outer end portion of the conductive material in the contact hole.

19. The capacitor according to claim 14, wherein a center position of the second contact hole is not aligned over a center position of the exposed impurity region, and wherein the leakage current is reduced by the diffusion barrier film covering the inner end portion of the first contact hole.

20. The capacitor according to claim 14, wherein the diffusion barrier film is one selected from the group consisting of Ti, TiN, Ru and Ir, wherein the first electrode and the second electrode are each one selected from the group consisting of Pt, $RuO_2$, $IrO_2$, Ru and Ir, wherein the dielectric film is a material having a higher dielectric constant than a silicon-based dielectric material, and wherein the dielectric film comprises BST ($(Ba,Sr)Ti_2O_3$), $Ta_2O_5$ or PZT ($Pb(Zr,Ti)O_3$).

21. A capacitor for a semiconductor memory device, comprising:
    a patterned first insulation film that exposes a top surface of a contact hole over a semiconductor substrate;
    a patterned second insulation film on the patterned first insulation film;
    a diffusion barrier film on side portions of the second insulation film, side portions of the first insulation film and the top surface of the contact hole;

a first electrode on the diffusion barrier film;

a dielectric film on the first electrode;

and a second electrode on the dielectric film, wherein a center position of a second hole of the patterned second insulation film is not aligned over a center position of the contact hole, and wherein the leakage current is reduce by the diffusion barrier film covering the outer end portion being the top surface of the contact hole;

wherein an interlayer insulation film on the semiconductor substrate has the contact hole therethrough which is filled with a conductive material, wherein an inner end portion of the conductive material in the contact hole is coupled to an exposed impurity layer, and wherein the first insulation film is a nitride film formed on an oxide film and the second insulation film is an oxide film.

\* \* \* \* \*